(12) United States Patent
Zhang et al.

(10) Patent No.: US 11,644,681 B2
(45) Date of Patent: May 9, 2023

(54) SEMICONDUCTOR LASER SHAPING DEVICE

(71) Applicant: Fujian Hitronics Technologies, Inc., Fuzhou (CN)

(72) Inventors: Shaofeng Zhang, Fuzhou (CN); Guanglei Ding, Fuzhou (CN); Jianyang Yang, Fuzhou (CN); Haocheng Hu, Fuzhou (CN); Huaping Zhang, Fuzhou (CN); Yawei Yan, Fuzhou (CN); Renliang Wan, Fuzhou (CN)

(73) Assignee: Fujian Hitronics Technologies, Inc., Fuzhou (CN)

( * ) Notice: Subject to any disclaimer, the term of this patent is extended or adjusted under 35 U.S.C. 154(b) by 556 days.

(21) Appl. No.: 16/795,430

(22) Filed: Feb. 19, 2020

(65) Prior Publication Data

US 2021/0255467 A1 Aug. 19, 2021

(51) Int. Cl.
*G02B 27/09* (2006.01)
*G02B 27/28* (2006.01)
*G02B 27/30* (2006.01)
*H01S 5/00* (2006.01)
*G02B 5/04* (2006.01)

(52) U.S. Cl.
CPC ............. *G02B 27/30* (2013.01); *G02B 5/045* (2013.01); *G02B 27/0916* (2013.01); *G02B 27/0955* (2013.01); *G02B 27/0966* (2013.01); *G02B 27/0972* (2013.01); *G02B 27/283* (2013.01); *G02B 27/286* (2013.01); *H01S 5/0071* (2013.01)

(58) Field of Classification Search
CPC ........ G02B 27/30; G02B 27/09; G02B 27/28; G02B 27/0916; G02B 27/0955; G02B 27/0966; G02B 27/0972; G02B 27/0905; G02B 27/0927; G02B 27/095; G02B 27/283; G02B 27/286; G02B 5/045; G02B 5/09; G02B 19/0057; G02B 19/0028; G02B 6/4204; G02B 6/4296; H01S 5/0071; H01S 5/005; H01S 5/0057; H01S 5/4012
USPC .......... 359/485.06, 618, 619, 641, 710, 741, 359/796, 719, 800, 834; 362/259, 297
See application file for complete search history.

(56) References Cited

U.S. PATENT DOCUMENTS

2004/0067016 A1* 4/2004 Anikitchev .......... G02B 27/283
385/11
2004/0252744 A1* 12/2004 Anikitchev ........ G02B 19/0028
372/100

* cited by examiner

*Primary Examiner* — Jie Lei
(74) *Attorney, Agent, or Firm* — SV Patent Service

(57) ABSTRACT

A semiconductor laser shaping device includes, along the light path of a semiconductor laser, a fast axis collimating lens, slow axis collimating lens, the half wave plate, a polarization beam combining prism, and a crawling prism group. The laser emitted by the semiconductor laser is collimated by a fast-axis collimating lens and then by a slow-axis collimating lens, and subsequently injected into a half wave plate and polarization beam combining prism, which compresses its spot size along the slow axis while keeping the spot size unchanged along the fast axis. The laser beam then passes through the crawling prism group, which shifts a portion of the light in the slow-axis direction to the fast-axis direction, which again compresses the light beam in the slow-axis direction. The device can reduce the beam size of a semiconductor laser in the slow-axis direction, reducing its beam parameter product and improving beam quality.

12 Claims, 5 Drawing Sheets

SEMICONDUCTOR LASER SHAPING DEVICE

TECHNICAL FIELD

The present application relates to the field of optical technology, and in particular, to a semiconductor laser shaping device.

BACKGROUND OF THE INVENTION

Semiconductor lasers have the advantages of high electro-optical conversion efficiency, small size, high power, high reliability, etc., and thus have broad applications in the fields of laser ranging, pump laser, material processing, and biomedical treatment. On the other hand, a semiconductor laser having a large light-emitting area has a large spot size and a large divergence angle. It is difficult for an ordinary beam shaping system to effectively improve the beam quality of a slow-axis direction light of a semiconductor laser having a large light-emitting area. Therefore, in order to obtain a wider range of applications, it is necessary to adopt a beam shaping method to solve the problem of poor beam quality and low power density.

In the application of semiconductor fiber-coupled lasers, there are many beam shaping and beam combining technologies for shaping and combining semiconductor laser arrays. A light spot is formed and coupled into an optical fiber for the pump source of a high-power laser, but the problem of poor beam quality is not solved.

SUMMARY OF THE INVENTION

In view of the conventional technologies, it is an object of the present invention to provide a semiconductor laser shaping device that is reliable and capable of improving coupling efficiency and beam quality. The disclosed semiconductor laser shaping device can improve the beam quality and power density of a single-tube semiconductor laser, and can further improve the coupling efficiency of a semiconductor laser array.

In order to achieve the above technical objectives, the following technical solution is adopted:

A semiconductor laser shaping device includes a semiconductor laser that can emit a laser beam; a slow axis collimating lens; a half wave plate; a polarization beam combining prism; and a crawling prism group arranged along an optical path. A laser beam is sequentially collimated by the slow axis collimating lens along the slow axis to produce a collimated laser beam. Portions of the collimated laser beam are injected into the half wave plate and the polarization beam combining prism, which folds and compresses a spot size of the collimated laser beam in the slow axis direction to produce a compressed light, while keeping the spot size unchanged along the fast axis. The compressed light subsequently passes through the crawling prism group, wherein a portion of the compressed light in the slow axis direction is shifted to the fast axis direction, which further folds and compresses the compressed light along the slow axis direction. The beam parameter product (BPP) is reduced to achieve improved beam quality.

Furthermore, the collimated laser beam can include a first portion and a second portion in the slow axis direction. The half wave plate can be so positioned along the optical path which allows the first portion of the collimated laser beam pass there through and then inject into the polarization beam combining prism. The second portion of the collimated laser beam can directly inject into the polarization beam combining prism. The half wave plate can rotate polarization of the first portion of the collimated laser beam by 90 degrees.

Furthermore, the half wave plate can span across about half of the collimated laser beam in the slow axis direction, wherein the first portion comprises is about half of the collimated laser beam in the slow axis direction.

Furthermore, an edge of the half wave plate can be located at a center of the collimated laser beam in the slow axis direction.

Furthermore, the polarization beam combining prism can combine the first portion and the second portion of the collimated laser beam.

The polarization beam combining prism can include a right-angled triangular prism and a rhombic prism, wherein the triangular prism is configured to receive the first portion of the collimated laser beam at a right angle.

Furthermore, the polarization beam combining prism can include a coating at the interface between a bevel surface of the rhombic prism and the triangular prism, wherein the coating is highly reflective to the first portion of the collimated laser beam and allows the second portion of the collimated laser beam to pass through.

Furthermore, the crawling prism group can include two or more crawling prisms.

Furthermore, the crawling prism group can include an incident surface, a first reflective surface, and a second reflective surface, wherein the first reflecting surface can be at an angle of 45 degrees to the incident surface, and the second reflecting surface can be at an angle of 45 degrees to a vertical surface relative to the incident surface.

Furthermore, a height of the first reflecting surface is the same as a width of the compressed light in the fast axis direction, wherein a width of the incident surface can be $1/n$ of a width of the compressed light in the slow axis direction, where $n=2, 3, 4 \ldots$.

Furthermore, positions of two of the two or more crawling prisms can be shifted along the optical path by a distance equal to a width of the compressed light along the fast axis.

The semiconductor laser shaping device can further include a fast axis collimating lens, wherein the laser beam is collimated in part by the fast axis collimating lens along the fast axis to produce a collimated laser beam.

Compared with the conventional technologies, the disclosed semiconductor laser shaping device has the beneficial effects that the spot size of the slow axis direction is compressed by the half wave plate and the polarization beam combining prism, and then the crawling prism group is adopted. The light in the slow axis direction is compressed again, thereby reducing the size of the slow axis direction of the laser emitted by the semiconductor laser, effectively reducing the beam parameter product and improving the beam quality.

BRIEF DESCRIPTION OF THE DRAWINGS

The present invention will be further described below in conjunction with the drawings and specific embodiments.

DETAILED DESCRIPTION OF THE INVENTION

The present invention will become apparent from the following detailed description of embodiments and from the accompanying drawings, but not limited to the scope of the invention in any way.

Figure 1:
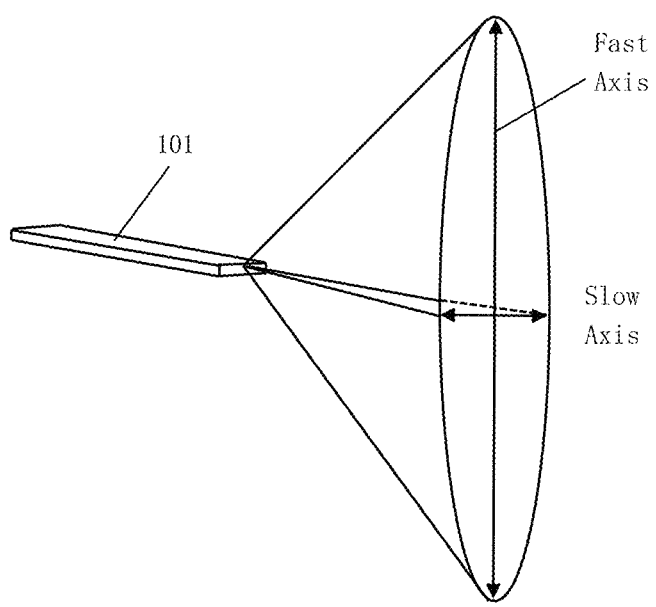
FIG. 1 is a perspective view illustrating the fast axis and the slow axis of a laser beam emitted by a semiconductor laser.
Figure 2:
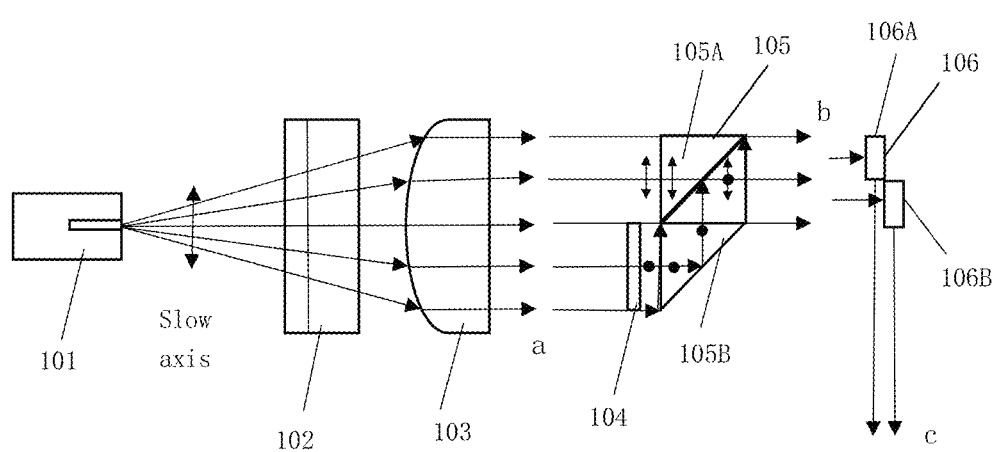
FIG. 2 is a schematic cross-sectional view showing components of a semiconductor laser shaping device in the plane of the slow axis of a laser beam emitted by a semiconductor laser in accordance with some embodiments of the present invention.

As shown in FIGS. 1 and 2, a semiconductor laser shaping device includes a semiconductor laser 101, (optionally) a fast axis collimating lens 102, a slow axis collimating lens 103, a half wave plate 104, a polarization beam combining prism 105, and a crawling prism group 106, which are sequentially disposed along an optical path.

The laser beam emitted from the semiconductor laser 101 is collimated by the fast axis collimating lens 102 and the slow axis collimating lens 103 to produce a collimated laser beam at position (a) in FIG. 2. The polarization of the collimated laser beam is the in the plane of the slow axis as shown in FIG. 2. The fast axis collimating lens 102 and the slow axis collimating lens 103 can be implemented by cylindrical lenses that are aligned to focus the laser beam respectively in the fast-axis and the slow-axis directions.

The upper edge of the half wave plate 104 is located at a center of the collimated laser beam such that the half wave plate 104 spans half of the along the collimated laser beam along the slow axis direction.

The laser beam output from the semiconductor laser 101 passes through the fast-axis collimating lens 102 and is collimated along its fast axis direction. The laser beam's divergence angle remains constant in the slow axis direction. Then laser beam is collimated in the slow axis direction by passing through the slow axis collimating lens 103. The divergence angle of the fast axis direction is constant. The collimated laser beam is then incident on the half wave plate 104.

A first portion of the collimated laser beam passes through the half wave plate, in which its polarization is rotated by 90 degrees to become parallel to the fast axis. Then first portion of the collimated laser beam injects into the polarization beam combining prism 105. A second portion of the collimated laser beam bypasses the half wave plate and directly injects into the polarization beam combining prism 105. In some embodiments, the polarization beam combining prism 105 can be implemented by a polarization beam splitter.

The polarization beam combining prism 105 includes a triangular prism 105A and a rhombic prism 105B. The right angle surface of the triangular prism 105A is configured to receive the second portion of the collimated light. The height of the angle surface of the triangular prism 105A is about half of the dimension of the collimated laser beam along the slow axis direction. The entry surface of the rhombic prism 105B is configured to receive the first portion of the collimated light that has just passed the half wave plate, whereas the height dimension of the entry surface of the rhombic prism 105B is also about half of the dimension of the collimated laser beam along the slow axis direction. The upper bevel surface of the rhombic prism 105B is glued to the lower bevel surface of the triangular prism 105A. The interface is coated with a high reflective coating that can reflect the first portion of the collimated laser beam and allows the second portion of the collimated laser beam to pass through.

Figure 3:
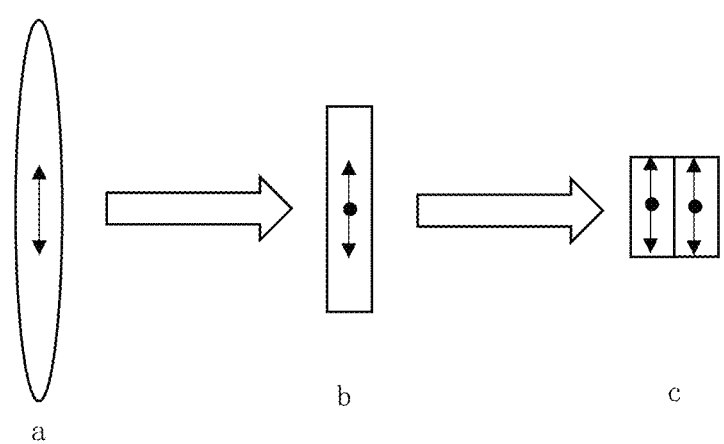
FIG. 3 is a schematic diagram the shapes of the laser beam spot and its polarizations in the plane of the slow axis direction at positions a, b, and c along the optical path shown in FIG. 1.

The optical axis and the slow axis polarization of the half wave plate 104 are The angle of the direction p light is 45 degrees, but since the upper edge of the half wave plate 104 is located at the center of the spot in the fast axis direction, the polarization direction of the light in the lower half (i.e. the first portion) of the collimated laser beam is rotated by 90 degrees, and becomes s light, the polarization direction of the upper part (i.e. the second portion) of the collimated laser beam remains unchanged, still p-light. The polarization beam combining prism is made of a triangular prism 105A and a rhombic prism 105B, and the s-light is totally reflected on the upper and lower surfaces of the rhombic prism 105B. The P light smoothly passes through the bonding surface of the triangular prism 105A and the rhombic prism 105B, so that the two portions of the collimated laser beams are fused together to form a cross-polarized compressed laser beam at position (b) in FIG. 2. As a result, as shown in FIG. 3, the spot size of the collimated laser in the slow axis direction is compressed by half from position a to position b. The spot size remains unchanged along the fast axis direction.

Figure 4:
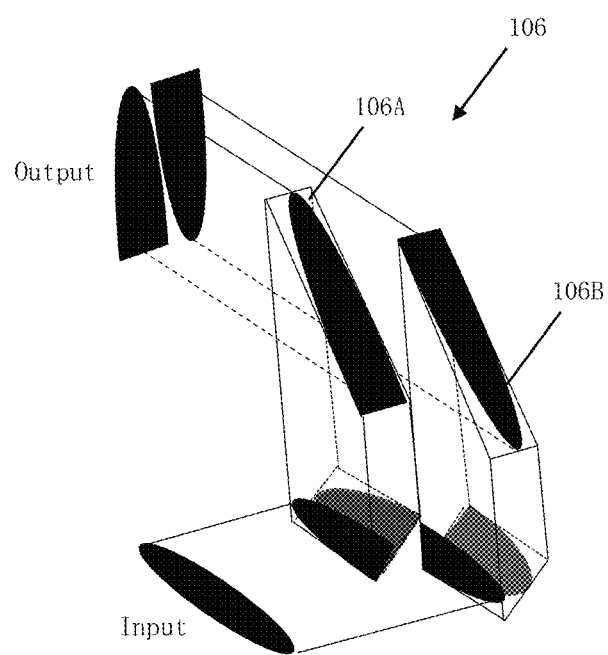
FIG. 4 is a schematic beam transition diagram of a crawling prism group in accordance with some embodiments of the present invention.

The light emitted by the polarization beam combining prism injects into the crawling prism group 106. As shown in FIG. 4, the crawling prism group 106 includes by the crawling prism 106A and the crawling prism 106B. The center of the spot of the compressed laser beam in the slow axis direction is located at the interface of the crawling prism 106A and the crawling prism 106B, which are displaced along the optical path by a distance equal to the width of the compressed beam along the fast axis. The compressed laser beam (at the input to the crawling prism group 106 in FIG. 4) is divided into two portion along the slow axis direction by the crawling prism 106A and the crawling prism 106B, which are respectively reflected by the first reflecting surface of the crawling prism 106A or 106B, then transmitted upward, and then reflected by the second reflecting surface of the crawling prism 106A or 106B. The trailing edge propagates perpendicularly to the plane of the paper, and finally half of the beam spot in the slow axis direction is displaced to the fast axis direction (at the output of the crawling prism group 106 in FIG. 4), thereby reducing the spot size in the slow axis direction, reducing the beam parameter product, and improving the beam quality.

In some embodiments, a crawling prism 106A or 106B can include an incident surface and two reflective surfaces, wherein the two reflective surfaces are a first reflective surface and a second reflective surface, wherein the first reflective surface is at an angle of 45 degrees to the incident surface, and the second reflecting surface is at an angle of 45 degrees with a vertical surface of the incident surface. Preferably, the height of the first reflecting surface of the crawling prism is the same as the width of the incident light (i.e. the compressed laser beam) in the fast axis direction. The incident surface width of the crawling prism is 1/n of the width of the incident light (i.e. the compressed laser beam) along the slow axis direction, where n=2, 3, 4 . . . .

Figure 5:
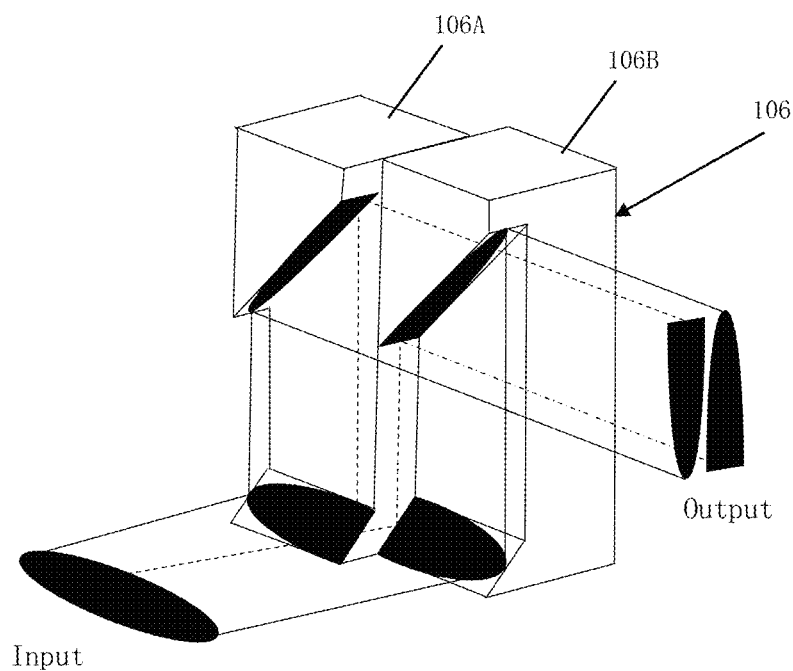
FIG. 5 is a beam transition diagram of another crawling prism group in accordance with some embodiments of the present invention.

In some embodiments, a crawling prism group 106 can also include two or more crawling prisms as shown in FIG. 5, wherein the operation principle is consistent with the crawling prisms shown and described in FIG. 4, and the details are not described herein again.

The above is an embodiment of the present invention, and those skilled in the art can make the patent scope according to the present invention without departing from the principle and spirit of the present invention. Equal variations, modifications, substitutions, and variations are intended to be within the scope of the present invention.

It is to be noted that the above contents are further detailed description of the present invention in connection with the disclosed embodiments. The invention is not limited to the embodiments referred to, but may be varied and modified by those skilled in the field without departing from the conception and scope of the present invention. The claimed scope of the present invention should be defined by the scope of the claims.

What is claimed is:

1. A semiconductor laser shaping device, comprising:
   a semiconductor laser configured to emit a laser beam;
   a slow axis collimating lens;
   a half wave plate;
   a polarization beam combining prism; and
   a crawling prism group arranged along an optical path,
   wherein the laser beam is sequentially collimated by the slow axis collimating lens along a slow axis to produce a collimated laser beam,
   wherein portions of the collimated laser beam are injected into the half wave plate and the polarization beam combining prism, which folds and compresses a spot size of the collimated laser beam along the slow axis to produce a compressed light beam having a single beam spot, while keeping the spot size unchanged along a fast axis, wherein the compressed light beam comprises a first portion and a second portion along the slow axis, wherein the compressed light beam subsequently passes through the crawling prism group,
   wherein the crawling prism group comprises:
      a first crawling prism comprising a first reflective surface and a second reflective surface, wherein the first reflective surface is configured to reflect the first portion of the compressed light beam toward the second reflective surface; and
      a second crawling prism comprising a third reflective surface and a fourth reflective surface, wherein the third reflective surface is configured to reflect the second portion of the compressed light beam toward the fourth reflective surface, which shifts the second portion of the compressed light beam relative to the first portion of the compressed light beam along the fast axis,
      wherein the second reflective surface and the fourth reflective surface are configured to respectively reflect the first portion and the second portion of the compressed light beam, which shifts the second portion of the compressed light beam relative to the first portion of the compressed light beam along the slow axis, thereby outputting a compact beam spot comprising the first portion and the second portion of the compressed light beam positioned side by side along the fast axis.

2. The semiconductor laser shaping device of claim 1, wherein the collimated laser beam includes a first portion and a second portion in the slow axis direction, wherein the half wave plate is so positioned along the optical path which allows the first portion of the collimated laser beam pass there through and then inject into the polarization beam combining prism, wherein the second portion of the collimated laser beam directly injects into the polarization beam combining prism, wherein the half wave plate is configured to rotate polarization of the first portion of the collimated laser beam by 90 degrees.

3. The semiconductor laser shaping device of claim 2, wherein the one-half wave plate spans across about half of the collimated laser beam in the slow axis direction, wherein the first portion comprises is about half of the collimated laser beam in the slow axis direction.

4. The semiconductor laser shaping device of claim 3, wherein an edge of the one-half wave plate is located at a center of the collimated laser beam in the slow axis direction.

5. The semiconductor laser shaping device of claim 2, wherein the polarization beam combining prism is configured to combine the first portion and the second portion of the collimated laser beam.

6. The semiconductor laser shaping device of claim 2, wherein the polarization beam combining prism comprises a right-angled triangular prism and a rhombic prism, wherein the triangular prism is configured to receive the first portion of the collimated laser beam at a right angle.

7. The semiconductor laser shaping device of claim 6, wherein the polarization beam combining prism includes a coating at the interface between a bevel surface of the rhombic prism and the triangular prism, wherein the coating is highly reflective to the first portion of the collimated laser beam and allows the second portion of the collimated laser beam to pass through.

8. The semiconductor laser shaping device of claim 1, wherein the first portion of the compressed light beam is injected into the first crawling prism, and wherein the second portion of the compressed light beam is injected into the second crawling prism, thereby splitting the first portion and the second portion of the compressed light beam.

9. The semiconductor laser shaping device of claim 1, wherein the first crawling prism comprises an incident surface, the first reflective surface, and the second reflective surface, wherein the first reflecting surface is at an angle of 45 degrees to the incident surface, and the second reflecting surface is at an angle of 45 degrees to a vertical surface relative to the incident surface.

10. The semiconductor laser shaping device of claim 9, wherein a height of the first reflecting surface is the same as a width of the compressed light beam in the fast axis direction, wherein a width of the incident surface is 1/n of a width of the compressed light beam in the slow axis direction, where n=2, 3, 4 . . . .

11. The semiconductor laser shaping device of claim 1, wherein the first crawling prism and the second crawling prism are shifted by a distance equal to a width of the compressed light beam along the fast axis.

12. The semiconductor laser shaping device of claim 1, further comprising:
   a fast axis collimating lens, wherein the laser beam is collimated in part by the fast axis collimating lens along the fast axis to produce a collimated laser beam.

* * * * *